United States Patent [19]
Olson et al.

[11] Patent Number: 4,557,657
[45] Date of Patent: Dec. 10, 1985

[54] ARTICLE HANDLING APPARATUS AND METHOD

[75] Inventors: Donald M. Olson, Scottsdale; Norman L. Jackson, Chandler; Jerry E. Tong, Tempe, all of Ariz.

[73] Assignee: Advanced Semiconductor Materials America, Inc., Phoenix, Ariz.

[21] Appl. No.: 538,411

[22] Filed: Oct. 5, 1983

[51] Int. Cl.[4] .................. B65G 25/04; B65G 49/00
[52] U.S. Cl. ................... 414/180; 74/89.17; 74/99 A; 74/110; 188/67; 188/69; 308/6 R; 414/749; 414/786; 901/14; 901/25
[58] Field of Search ............... 414/160, 172, 180, 749, 414/751, 589, 83, 150, 750, 347, 392, 564, 522, 607, 282, 718, 667; 901/16, 9, 14, 25; 432/36, 239; 198/774, 861, 862; 188/67, 69; 308/4 R, 6 B, 6 R; 74/531, 89.17, 422, 110, 99 A, 99 R, 107, 425; 212/184, 187, 189, 264, 267, 269

[56] References Cited
U.S. PATENT DOCUMENTS

| | | | |
|---|---|---|---|
| 3,194,611 | 7/1965 | Mahony | 308/6 B |
| 3,665,148 | 5/1972 | Yasenchak et al. | 901/16 X |
| 3,753,489 | 8/1973 | Tomioka et al. | 414/750 X |
| 3,830,382 | 8/1974 | Nagamori | 901/9 X |
| 3,892,324 | 7/1975 | Faletti, Jr. | 414/749 |
| 4,008,815 | 2/1977 | Fisk | 414/180 |
| 4,392,524 | 7/1983 | Bauch | 248/68.1 X |
| 4,468,195 | 8/1984 | Sasaki et al. | 414/180 X |

Primary Examiner—Leslie J. Paperner
Assistant Examiner—Lyle Kim
Attorney, Agent, or Firm—Weiss & Holloway

[57] ABSTRACT

An article handling device which is particularly well suited for loading articles into a reactor furnace for processing and subsequently unloading the processed articles. The article handling device is supported and vertically movable into alignment with the reactor furnace and includes an article moving device which is reciprocally vertically elevatable and reciprocally horizontally extensible for loading the articles into the reactor furnace and subsequent unloading thereof with minimal disturbing of the reactor process residue which is inherently deposited in the interior of the reactor furnace.

73 Claims, 25 Drawing Figures

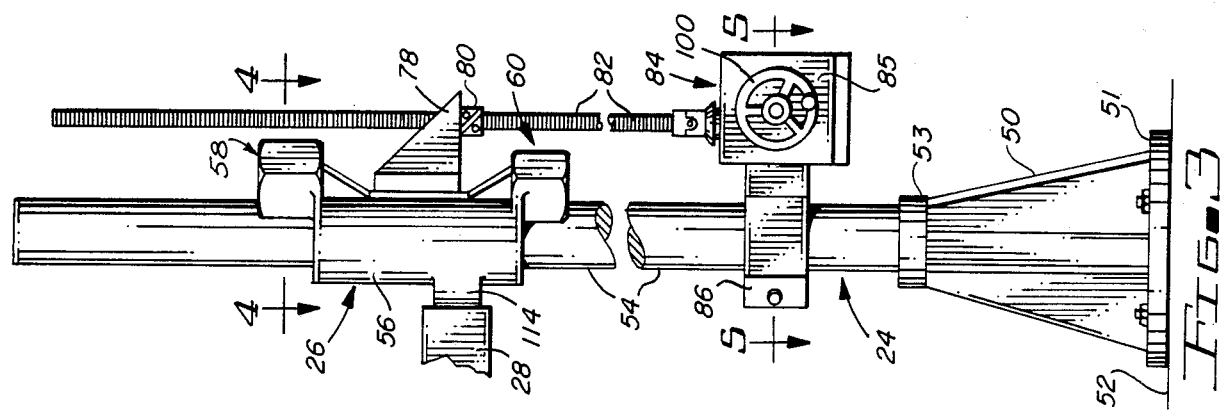
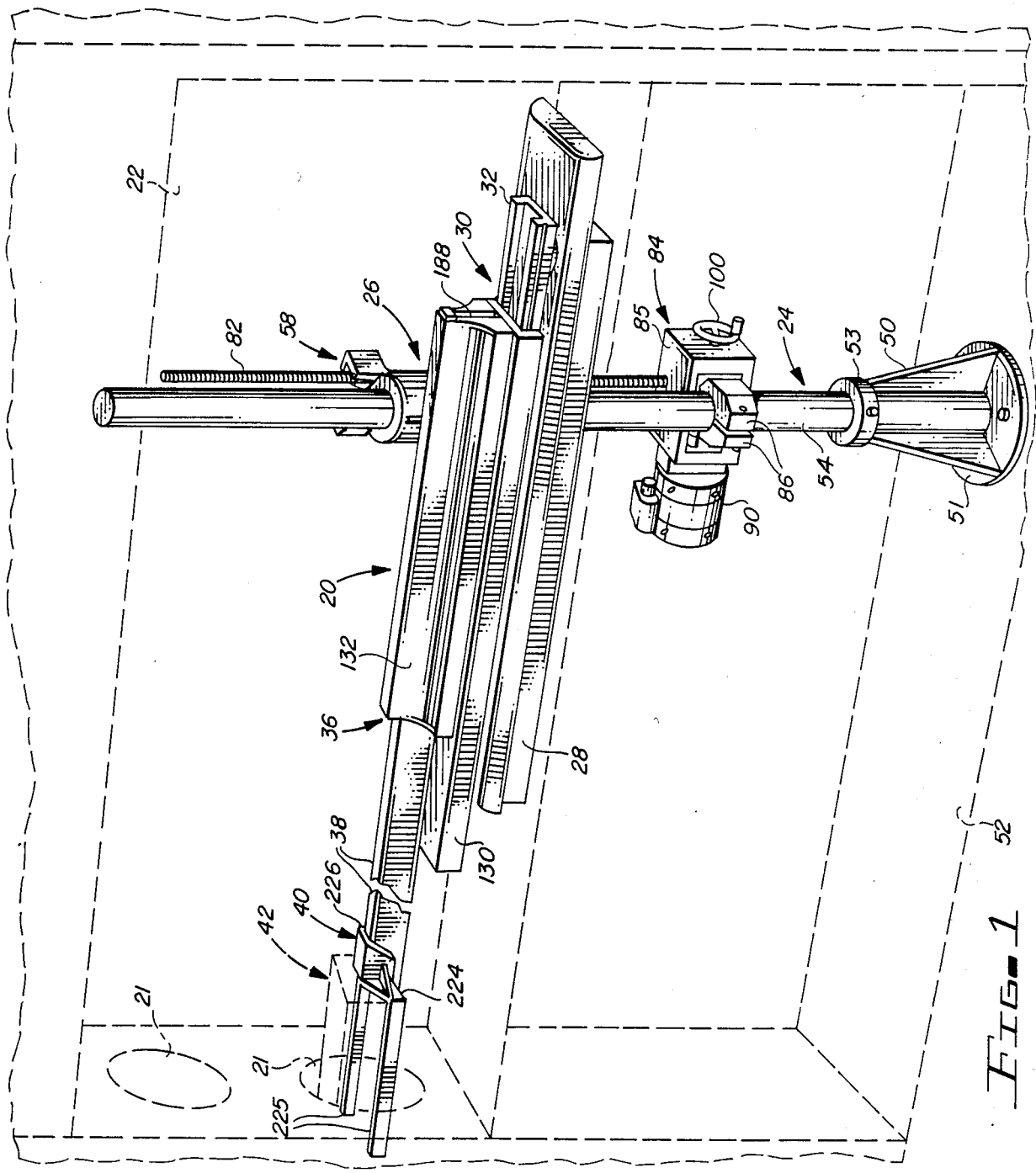

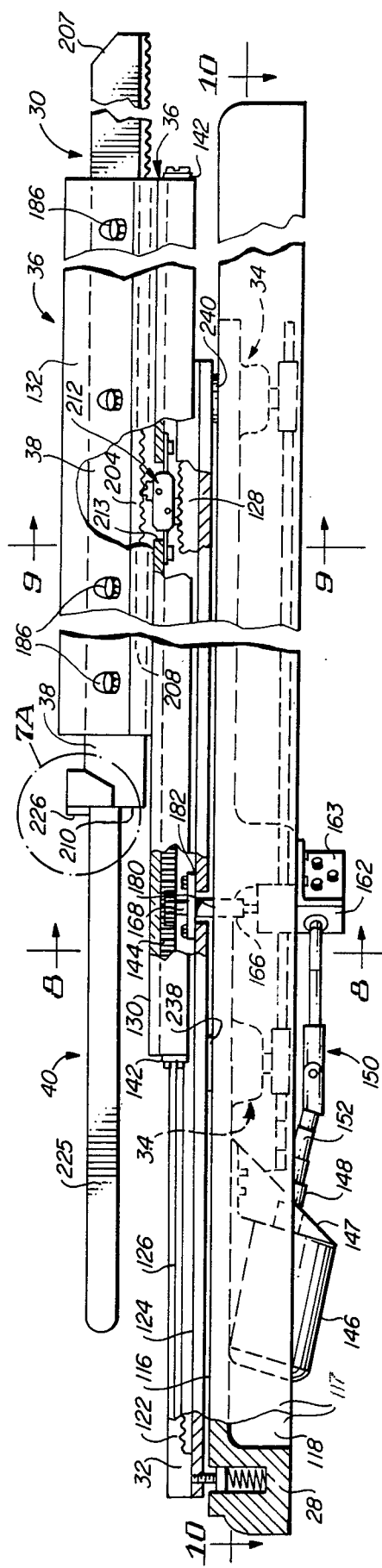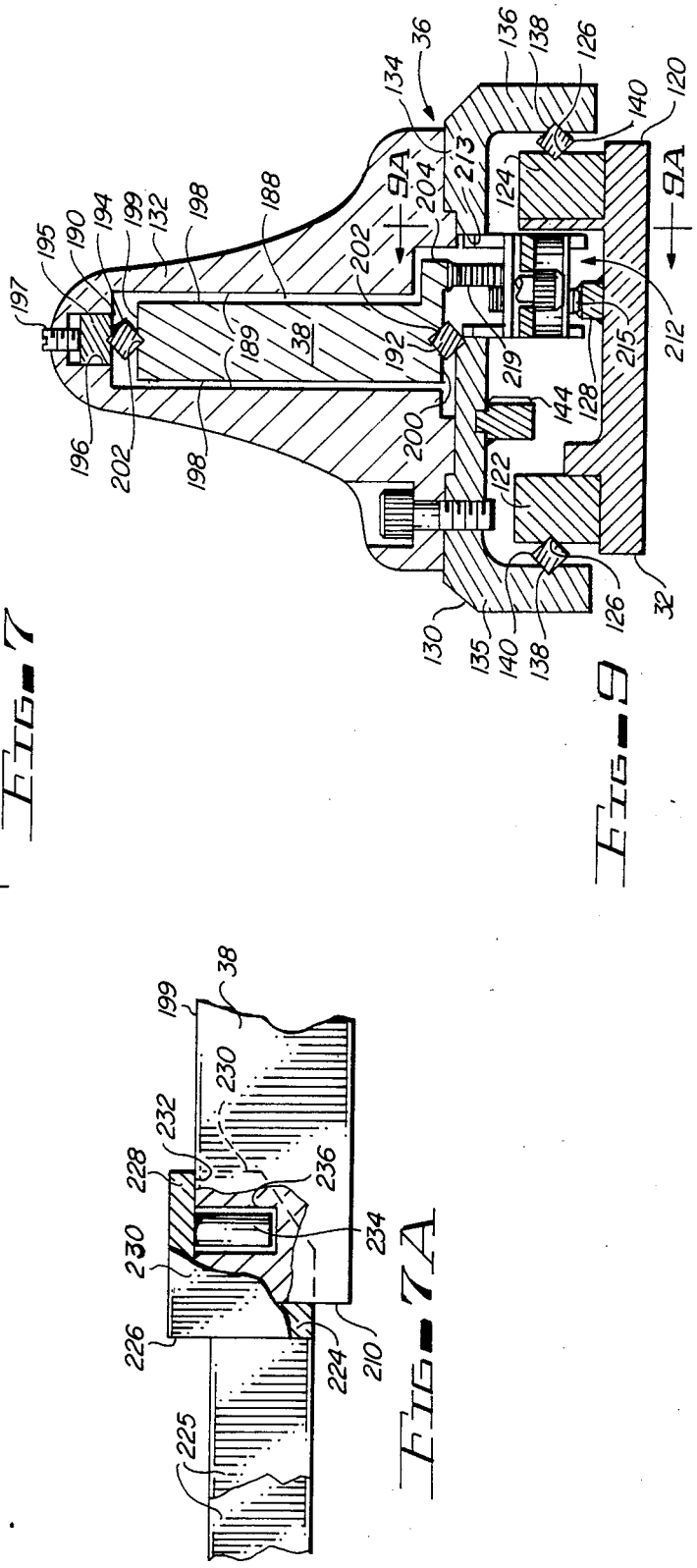

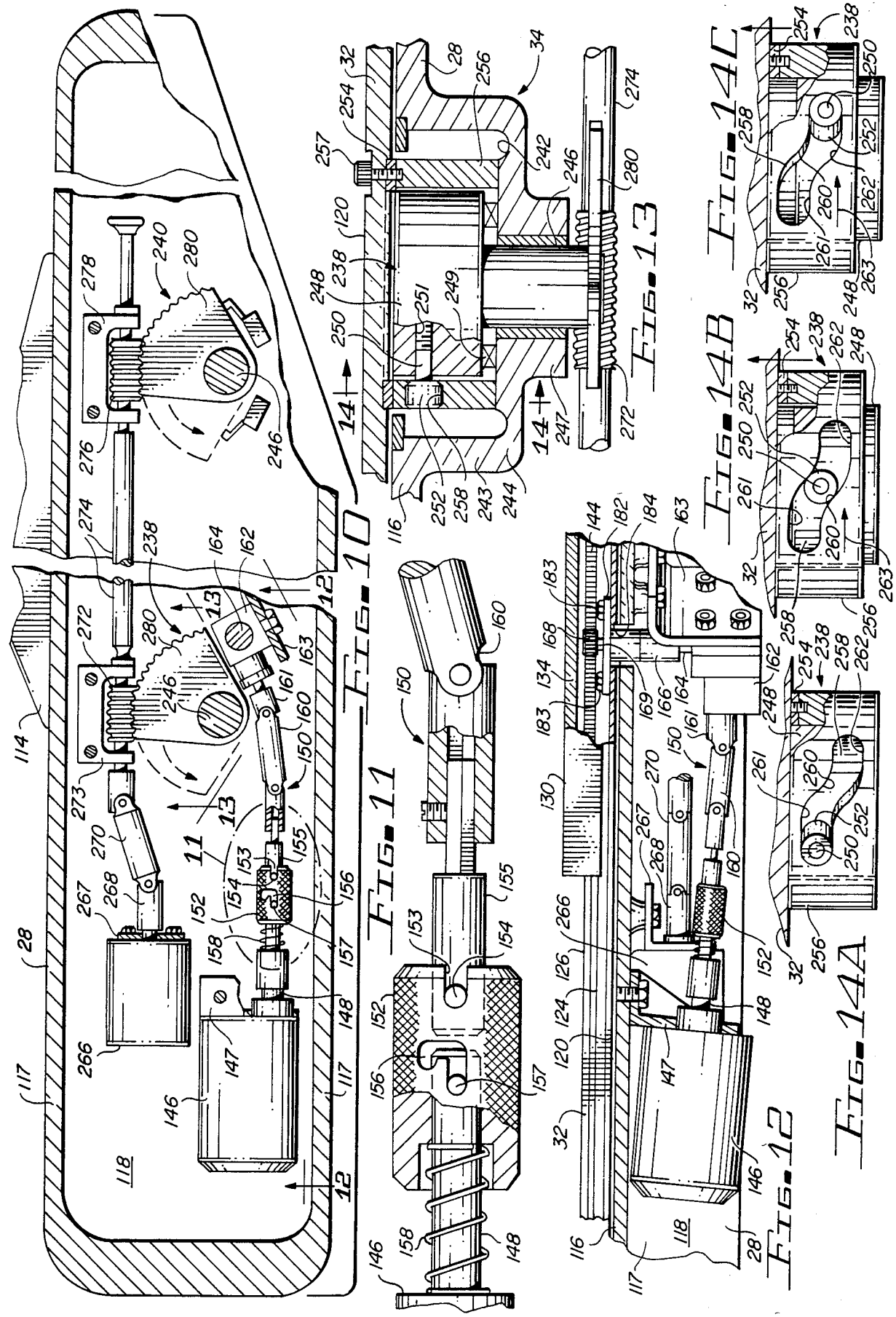

ARTICLE HANDLING APPARATUS AND METHOD

BACKGROUND OF THE INVENTION

1. Field of the Invention

This invention relates in general to article handling mechanisms and more particularly to an apparatus and method for handling various articles of manufacture which are to be processed in reactor furnaces in a manner which minimizes environmental contamination of the articles.

2. Description of the Prior Art

As is well known in the electronics arts, the manufacturing of various articles, such as low temperature oxide silicone wafers, must be accomplished with extreme care to keep such articles from being damaged and possibly ruined as a result of environmental contamination, and the requirements for a clean non-contaminating manufacturing environment and process are becoming more stringent all the time.

One particular phase of the manufacturing of this type of article which is very troublesome from a contamination standpoint is the processing of the articles in reactor furnaces. Operation of reactor furnaces inherently results in a process residue being deposited on the interior walls of the furnaces and this residue will easily become airborne if disturbed, such as during loading and unloading of the articles being processed in the furnaces.

It is a common practice to load a plurality of the articles to be processed in supporting structures which are referred to in the industry as "boats", and the boats may be formed of various materials and of various configurations as dictated by the particular articles being handled and the particular process to be accomplished in the reactor furnaces. However, the boats are generally elongated structures of substantially parallelogram cross sectional configuration with multiple compartments formed therein for receiving the articles to be processed. Such boats have traditionally been provided with wheels by which they are rolled into and out of the reactor furnaces.

The prior art loading and unloading devices have traditionally included an upwardly opening semi-circular trough into which the boats are loaded. The trough is supported by a suitable framework which is hand operated to elevate the trough, and thus the boat, into alignment with a selected one of a plurality of vertically stacked reactor furnaces, into which the boat is to be loaded. When aligned, the boat is manually pushed so that it rolls from the trough into the reactor furnace. When the processing of the articles is completed, the boat is manually pulled from the reactor furnace so that it rolls therefrom back onto the trough of the prior art loading and unloading device.

The rolling of the article supporting boat into and out of the reactor furnace will disturb the reaction process residue present on the interior sidewalls of the reactor furnace as a direct result of the operation of the furnace. When so disturbed, the residue will become an airborne contaminant which can damage, and sometimes completely ruin, the articles being processed. This prior art boat loading and unloading device has been used for sometime, but is no longer acceptable due to the increasingly stringent requirement for a clean and non-contaminating manufacturing environment and the processes associated therewith. The first problem with the prior art loading and unloading device is the above described rolling insertion into, and subsequent extraction of the boats from the reactor furnace which inherently creates an unacceptable amount of environmental contamination. The second problem results from the required manual operation of the article handling device per se, and the manual pushing and pulling of the boat. The loading area immediately in front of the reactor furnace is a very uncomfortable place for anyone to work in due to high operating temperatures of the reactor furnaces which must be open during loading and unloading operations. The natural tendency is for a worker to hurry through the trough alignment operation as well as the pushing to load and pulling to unload operations so that he can leave the extremely hot loading area. Hurried accomplishment of these operations can produce extremely aggravated environmental contamination resulting from misalignment of the trough relative to the reactor furnace, and there is very little margin for misalignment errors in that very little clearance exists between the boat and the interior sidewalls of the furnace. And, if the boat is not carefully pushed straight into or pulled straight out of the reactor furnace, the boat can assume a skewed attitude causing the wheels to skid rather than roll along the interior surfaces of the reactor furnaces.

Therefore, a need exists for a new and improved article handling apparatus and method which overcomes some of the problems and shortcomings of the prior art.

SUMMARY OF THE INVENTION

In accordance with the present invention, a new and improved apparatus for precision handling of various articles of manufacture is disclosed with the apparatus being particularly well suited for minimizing contamination of the articles being handled thereby for processing in a reactor furnace.

The article handling apparatus of the present invention includes a platform upon which an article moving means is mounted with the article moving means having an article carrier means on one end thereof. The platform houses a first drive means which is coupled to extensibly and reciprocally drive the article moving means horizontally between a retracted position and an extended position relative to the platform, and a second drive means which is coupled for driving the article moving means vertically between an elevated position and a lowered position relative to the platform during the article handling operations thereof.

In some instances, the platform of the article handling apparatus may be fixedly carried on a suitable support surface which is aligned with a single reactor furnace. In such instances, the article handling apparatus will service, i.e., load and unload, that single reactor furnace.

However, in most manufacturing facilities, a vertically stacked plurality of reactor furnaces are employed for production efficiency reasons, and in such cases, the article handling apparatus is supportingly carried on an apparatus elevating mechanism to allow servicing of each of the plurality of vertically stacked reactor furnaces.

It is a common practice to locate the reactor furnace or furnaces and the adjacent article loading area in an environmentally clean work station, and this is accomplished by providing suitable laminar airflow equipment proximate the furnaces and the loading area. To minimize the size of the laminar airflow equipment and for stability of the article handling apparatus, the article moving means of the apparatus is preferably of special configuration.

The preferred embodiment of the article moving means comprises an elongated carriage which is reciprocally movable on the platform toward and away from the reactor furnace, and a beam is telescopically carried by the carriage for extensibly reciprocal movement relative to the carriage. The first drive means housed in the platform is coupled to reciprocally drive the carriage and a gear means is interconnectingly interposed between the carriage and the beam so that when the carriage is moved, the gear means will simultaneously drive the beam in the same direction as the carriage and in an extensibly reciprocal movement relative to the carriage. In this manner, the article moving means is relatively compact when in the retracted position which keeps the size of the laminar airflow equipment to a minimum, and since the extension of the article moving means is accomplished by two relatively short extensible structures, rather than a single relatively longer extensible structure, the structural stability of the article moving means is maximized.

Reactor furnaces customarily employed for processing articles of the type hereinbefore described, have a circular cross section which is just slightly larger than the cross sectional dimensions of the supporting structures, or boats, in which the articles are placed for handling and processing. Therefore, the article handling apparatus of the present invention must have the previously described high structural stability and must be capable of loading the boat into the reactor furnace, and subsequently unloading the boat, without allowing it to drag along or otherwise contact the interior sidewalls of the reactor furnace during loading and unloading operations. For this reason, the second drive means housed in the platform is coupled to a lifting means which is mounted on the platform and connected to the article moving means for changing the vertically spaced relationship between the platform and the article moving means. At the beginning of an article loading operation, the article moving means is in the horizontally retracted and vertically lowered position and when in this position the boat which is provided with laterally extending ears on opposite sides thereof, and has depending feet rather than wheels, is placed on the article carrier means provided on the extensible end of the article moving means. Prior to moving the article moving means to its extended position, the second drive means is actuated to elevate the article moving means to its elevated position relative to the platform. When elevated, the longitudinal centerline of the boat is in substantial aliginment with the axial centerline of the reactor furnace to be loaded, and then the first drive means is actuated to move the article moving means to its horizontally extended position. When nearing completion of the horizontal extension movement of the article moving means, the boat will enter the reactor furnace without touching the interior sidewalls thereof. When fully horizontally extended, the second drive means is again actuated to operate the lifting means in the reverse direction to lower the article moving means to its vertically lowered position. At an intermediate point of movement from the elevated to the lowered positions of the article moving means, the boat will gently move into resting supporting engagement with the sidewalls of the reactor furnace, and the balance of the downward movement of the article moving means will disengage the article carrier means from the boat. The first drive means is then actuated in a reverse direction which horizontally extracts the article carrier means from the reactor furnace and returns the lowered article moving means to its retracted position. When the article processing is completed, the article moving means, which is in the horizontally retracted and vertically lowered positions thereof, is moved to its fully extended position by actuation of the first drive means and when fully horizontally extended, the second drive means is actuated to operate the lifting mechanism to raise the article moving means to its elevated position. During such elevational movement of the article moving means, the article carrier means will move into supporting engagement with the boat and gently lift it away from the interior sidewalls of the reactor furnace. When the article moving means reaches its elevated position in which the boat is substantially centered within the reactor furnace, the first drive means is again actuated to extract the boat from the reactor furnace by virtue of the article moving means being returned to its horizontally retracted position.

The apparatus of the present invention is ideally provided with suitable sensor means, such as limit switches, and the like, for sensing various operations of the apparatus and providing operational indicating signals. Such signals are supplied to a suitable operation control mechanism which is programmed to control the timing, operational sequences, and other functions of the apparatus. Such automation of the apparatus is preferred, however, the apparatus is provided with disconnecting devices which allows, for example, the article moving means to be selectively operated by either a drive motor or by hand, with such hand operational capability facilitating servicing, adjusting, and the like.

From the foregoing, it will be seen that the article handling apparatus of the present invention overcomes the problems and shortcomings of the prior art by providing a precision apparatus which is capable of handling various articles, of the type that are susceptible to damage from contamination during manufacturing, in a manner which minimizes the possibility of contamination. And, the apparatus is fully automatable which eliminates the prior art requirement for an operator to work in an undesirable environment and thereby also eliminates the possibility of errors resulting from such a working environment.

Accordingly, it is an object of the present invention to provide a new and improved article handling apparatus and method.

Another object of the present invention is to provide a new and improved apparatus and method for precision handling of various articles of the type that are susceptible to contamination damage during manufacturing in a manner which minimizes the possibility of contamination damage.

Another object of the present invention is to provide a new and improved apparatus and method for handling various articles, with the apparatus being fully capable of being automatic to eliminate the need for an operator to work in an undesirable environment and to eliminate the possibility of operator error resulting from the undesirable working environment.

Another object of the present invention is to provide a new and improved apparatus and method of the above described character which are particularly well suited for loading various articles into a reactor furnace for processing therein and subsequent unloading of the articles.

Another object of the present invention is to provide a new and improved apparatus and method of the above described character which are capable of serially loading various articles into a vertically stacked plurality of reactor furnaces for processing therein and subsequent unloading of the articles.

Still another object of the present invention is to provide a new and improved apparatus of the above described character which includes a horizontally extensibly reciprocal article moving means which is of special configuration so that the apparatus is compact when in its horizontally retracted position to minimize the size of the associated air cleaning equipment and has high structural stability when in the horizontally extended position for precision handling of the various articles.

Yet another object of the present invention is to provide a new and improved apparatus of the above described type wherein the horizontally extensibly reciprocal article moving means is provided with lifting means by which the articles being handled thereby can be inserted into and subsequently extracted from the reactor furnaces without coming into contact with the interior sidewalls of the furnaces during insertion or retraction.

The foregoing objects of the present invention as well as the invention itself, may be more fully understood from the following description when read in conjunction with the accompanying drawings.

BRIEF DESCRIPTION OF THE DRAWINGS

FIG. 1 is a perspective view of the article handling apparatus of the present invention illustrating the various features thereof and showing the apparatus in a typical working environment in which its use is particularly well suited.

FIG. 3 is a fragmentary end elevational view of the apparatus which includes an apparatus supporting and moving means which is associated with the apparatus when it is employed to service a plurality of vertically stacked article processing mechanisms.

FIG. 7 is a side elevational view of the article moving means portion of the apparatus of the present invention which is partially broken away to show the various features thereof.

FIG. 7A is an enlarged fragmentary elevational view which is partially broken away to show the features of the encircled portion identified as 7A in FIG. 7.

FIG. 9 is an enlarged fragmentary sectional view taken along the line 9—9 of FIG. 7.

FIG. 10 is an enlarged fragmentary sectional view taken along the line 10—10 of FIG. 7.

FIG. 11 is an enlarged fragmentary elevational view which is partially broken away to show the features of the encircled portion identified as 11 in FIG. 10.

FIG. 12 is an enlarged fragmentary sectional view taken along the line 12—12 of FIG. 10.

FIG. 13 is an enlarged sectional view taken along the line 13—13 of FIG. 10.

FIGS. 14A, 14B and 14C are sectional views taken along the line 14—14 of FIG. 13 showing the operational positions of the lifting device shown in FIG. 13.

DESCRIPTION OF THE PREFERRED EMBODIMENT

Figure 2:
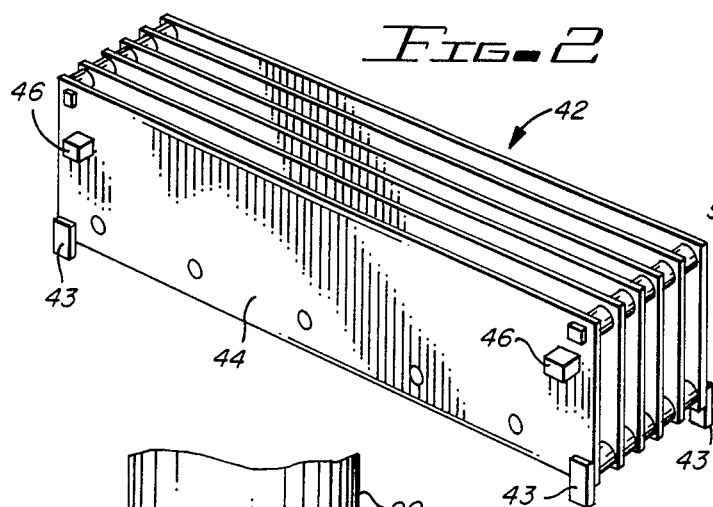
FIG. 2 is a perspective view of a typical structure for carrying a plurality of the various articles which are ideally handled by the apparatus of the present invention.

Referring more particularly to the drawings, FIG. 1 shows the article handling apparatus of the present invention, which is indicated generally by the reference numeral 20. FIG. 1 also shows the apparatus 20 as being used in a typical environment which includes a plurality of vertically stacked reactor furnaces 21 and suitable clean air equipment 22, such as a laminar airflow device. The reactor furnaces 21 and the air cleaning equipment 22 are well known in the art, and the description of those devices herein will be limited to the various features thereof which are deemed as being necessary for a complete understanding of the features and operation of the apparatus 20.

It will be appreciated from the following description that the apparatus 20 may be utilized for handling virtually anything. However, the apparatus 20 is particularly well suited for handling various articles, such as low temperature oxide silicone wafers, wafers to be used for high temperature epitaxial processing, i.e., about 1000° C., or other semiconductor wafers which need to be handled in a clean environment and which are to be processed in the reactor furnaces 21. For this reason, the following description will be directed to the use of the apparatus 20 for the loading of such articles into the reactor furnaces 21 for processing and subsequent unloading of the processed articles, with such loading and unloading being accomplished in the clean environment provided by the equipment 22.

As will hereinafter be described in detail, the article handling apparatus 20 of the present invention comprises the major sub-assemblies of a support means 24 which has a carrier means 26 vertically movably mounted thereon. A substantially horizontally disposed platform 28 is supported by the carrier means 26 for vertical movement therewith. An article moving means 30 is mounted on the platform 28 and is operable to be vertically elevated and retracted relative to the platform 28 and to be horizontally extended and retracted relative to the platform. The article moving means 30 includes an elongated guide plate 32 which is coupled to the platform 28 by a lifting means 34 which is operable to vertically elevate and retract the guide plate. A carriage means 36 is carried on the guide plate 32 for reciprocally extensible movement along the length thereof and the carriage means 36 has a reciprocally extensible beam 38 telescopically mounted therein. The extending end of the beam 38 is configured to demountably support an article carrier means 40.

Before proceeding with the detailed description of the major sub-assemblies mentioned above, reference is made to FIG. 2 wherein one type of article supporting device 42 is shown. Article supporting devices of this nature are referred to in the art as boats, and the boat 42 shown in FIG. 2 has been modified from the configuration normally used in the art. Prior art boats normally include wheels by which the boats are rolled into and out of the reactor furnaces 21. As shown, the boat 42 includes a foot 43 depending from each corner of its elongated multi-compartment body 44, with the feet 43 replacing the wheels of the prior art structures. The boat 42 is further modified from the prior art by being provided with lifting ears 46 which extend normally from the opposite sides of the boat body 44. The purpose and function of the modified boat structure 42 will hereinafter be described in detail.

The support means 24 includes a pedestal 50 having a base plate 51 which is preferably anchored to the floor 52, such as with suitable bolts, and has an upstanding socket member 53 in which an elongated cylindrical standard 54 is rigidly supportingly mounted so that the standard 54 is disposed in a substantially vertical attitude.

The platform carrier means 26, as seen best in FIGS. 3, 4, 5 and 6, includes a tubular sleeve 56 which defines an axial bore 57 with the sleeve 56 being coaxially mounted on the vertical standard 54 and axially movable along the length thereof. The tubular sleeve 56 is provided with an upper stabilizer means 58 and an identical lower stabilizer means 60. Since the stabilizer means 58 and 60 are identical, the following detailed description of the upper stabilizer means 58 will be understood to also apply to the lower stabilizer means 60.

Figure 4:
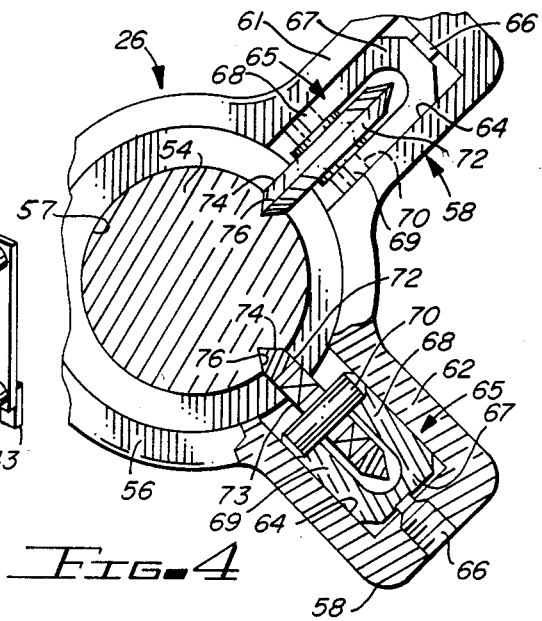
FIG. 4 is an enlarged fragmentary sectional view taken along the line 4—4 of FIG. 3.
Figure 5:
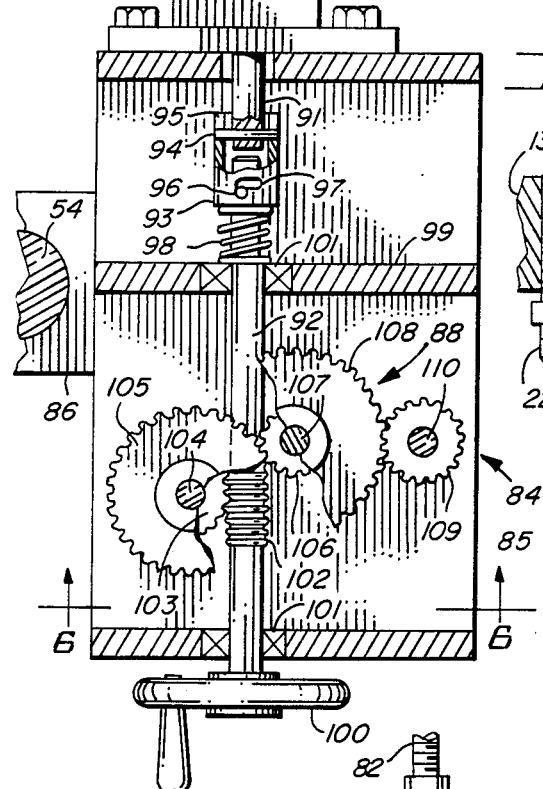
FIG. 5 is an enlarged fragmentary sectional view taken along the line 5—5 of FIG. 3.

The upper stabilizer means 58, as shown in FIG. 4, includes a pair of enclosure housings 61 and 62 which are cast, or otherwise integral with the sleeve 56 and extend radially therefrom so that the housings 61 and 62 are at substantially a right angle with respect to each other. Each of the enclosure housings 61 and 62 define an internal cavity 64 which opens inwardly toward the periphery of the tubular standard 54. A clevis-shaped member 65 is mounted in each of the cavities 64 of the enclosure housings 61 and 62, and the clevises are movable in those cavities toward and away from the periphery of the standard 54. An adjusting screw 66 is threadingly carried in each of the enclosure housings 61 and 62 for bearing engagement with the bight portions 67 of the clevis members 65, and the extending ends of the spaced tines 68 and 69 which extend from the bight portions 67 of their respective clevis members 65 toward the open ends of the cavities 64, each have an axle 70 extending transversely therebetween. A roller 72 is rotatably carried, such as by means of suitable bearings 73 (one shown) on each of the axles 70 and the rollers 72 are formed with an endless V-shaped in cross section beveled peripheral edge 74. The rollers 72 are in rolling bearing engagement with V-shaped grooves 76 aligningly formed along the length of the standard 54, with the rollers being loaded into proper engagement therewith by means of the adjusting screws 66.

From the above, it will be seen that the stabilizer means 58 and 60 are adjustable so that the longitudinal axis of the standard 54 and of the tubular sleeve 56 can be brought into and will maintain a perfect coaxial relationship, and the carrier means 56 will be kept from rotatably moving about the longitudinal axis of the vertical standard 54.

The tubular sleeve 56 of the carrier means 26 is provided with a bracket 78 extending integrally therefrom which captively retains a worm gear nut 80 which is in meshing engagement with an elongated worm gear 82 which extends vertically upwardly from a vertical drive means 84, which is fixedly mounted on the vertical standard 54 below the sleeve 56 as best seen in FIG. 3.

The vertical drive means 84 includes a housing 85 which is attached to the standard 54 by means of a suitable clamping device 86, and the housing 85 contains a reduction gear train 88 which is driven by a reversible electric motor 90. The motor 90 is suitably mounted on the housing 85 and has an output shaft 91 which is connected to a gear train drive shaft 92 by means of a coupling nut 93. The output shaft 91 of the motor has a pin 94 extending transversely therethrough, and the pin 94 is demountably contained in a cross slot 95 formed across one end of the coupling nut 93 and opening onto that end of the nut. The drive shaft 92 is provided with a pin 96 which extends radially therefrom through a right angle slot 97 formed proximate the opposite end of the coupling nut 93. The coupling nut 93 is biased toward the output shaft 91 of the motor 90 by a compression spring 98 which has one end in bearing engagement with a partition 99 provided in the housing 85 and has its opposite end in bearing engagement with the coupling nut 93. The spring 98 biasingly urges the nut 93 toward the motor 90 which loads the cross slots 95 of the nut into engagement with the transverse pin 94 of the motor output shaft 91 and the pin 96 of the gear train drive shaft 92 in the end of the axial portion of the right angle slot 97 which is furthest from the motor 90. In this manner, the motor output shaft 91 is coupled to the gear train drive shaft 92. The coupling nut 93 may be axially pulled manually against the biasing force of the spring 98 to disengage the cross slots 95 from the transverse pin 94 of the motor output shaft 91, and by axially rotating the nut 93 to bring the pin 96 of the drive shaft 92 into the angular portion of the right angle slot 97, the nut may be locked against axial movement toward the motor output shaft 91, and thereby decouple the motor output shaft 91 from the gear train drive shaft 92.

In this manner, the gear train drive shaft 92 may be driven by the motor 90 or by the hand wheel 100 which is suitably carried on the opposite end of the gear train drive shaft.

The gear train drive shaft 92 is journaled for rotation in bearings 101 which are carried in the housing 85 and a worm gear 102 is provided on the drive shaft intermediate its opposite ends. The worm gear 102 is in meshed engagement with a relatively small spur gear 103 which is fixedly attached to a shaft 104 which is rotatably mounted in the housing 85. A relatively larger spur gear 105 is also mounted fast on the shaft 104 for rotation therewith and this gear 105 is in meshed engagement with a relatively small spur gear 106 which is fixedly attached to a second shaft 107 which is rotatably journaled in the housing 85. A relatively large spur gear 108 is mounted on the second shaft 107 for rotation therewith, and this relatively large gear is in driving meshed engagement with a relatively small spur gear 109 which is carried by a gear box output shaft 110, which is rotatably journaled in the housing 85 and has an output end 111 extending vertically upwardly from the housing.

The output end 111 is coupled by means of a universal joint 112 to the lower end of the vertically extending elongated worm gear 82.

As hereinbefore mentioned, the worm gear 82 is in meshing engagement with the worm gear nut 80 which is carried on the bracket 78 of the sleeve 56 of the carrier means 26. Thus, rotational driving of the worm gear 82 by means of the drive motor 90, or alternately by means of the hand wheel 100, at a reduced speed determined by the gear ratios of the reduction gear train 88, will result in vertical movement of the carrier means 26 axially on the standard 54 in either an upward direction or a downward direction as determined by the driven direction of the reversibly drivable motor 90, or the direction of rotation of the manually operated hand wheel 100.

As shown best in FIG. 3, the carrier means 26 is provided with an integral structural member 114 which extends normally from the tubular sleeve 56, in a diametrically opposed relationship with respect to the bracket 78 thereof. The structural member 114 is integral with, or suitably attached to, the platform 28 so that the platform is supported in a substantially horizontal plane and is vertically movable with the carrier means 26.

The platform 28 is an elongated substantially rectangular structure having a planar top 116 with an endless depending sidewall 117 with the top surface 116 and the sidewall 117 cooperatively forming a downwardly opening cavity 118, as seen best in FIGS. 7 and 10.

Figure 8:
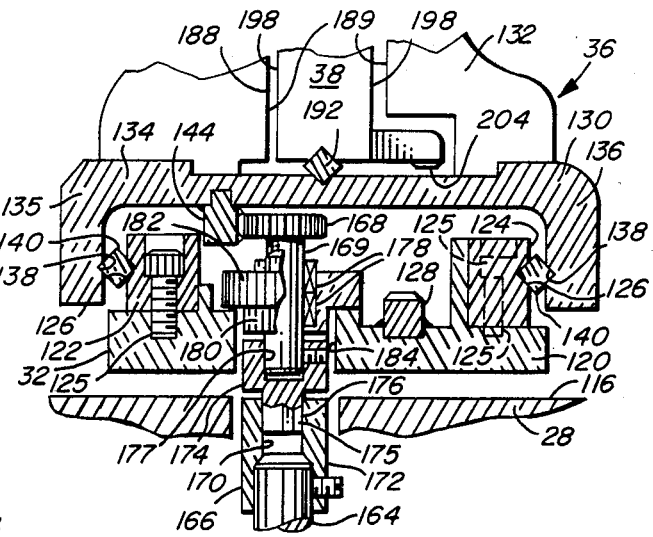
FIG. 8 is an enlarged fragmentary sectional view taken along the line 8—8 of FIG. 7.

The guide plate 32 is mounted in upwardly spaced juxtaposed overlaying relationship with respect to the planar top 116 of the platform 28, with the mounting being accomplished by the lifting means 34 as will hereinafter be described in detail. The guide plate 32 is an elongated substantially rectangular structure which includes, as best seen in FIGS. 8 and 9, a flat plate 120 having a spaced apart pair of upstanding guide rails 122 and 124 mounted on the upper surface of the plate 120, such as with suitable fastener bolts 125. The guide rails 122 and 124 extend the full length of the plate 120 and each of the rails is formed with a V-shaped groove 126 on its outwardly facing vertical surface. The guide plate 32 is further provided with a longitudinally extending gear rack 128 which is intermediate and parallel with respect to the guide rails 122 and 124 and is welded or otherwise fixedly attached so as to extend upwardly from the plate 120.

The guide plate 32 is fixed insofar as any movement relative to the platform 28 in the horizontal plane is concerned, and the guide plate acts as a track mechanism along the length of which the carriage means 36 is reciprocally movable.

The carriage means 36 is a two piece assembly including a lower carriage housing 130 and an upper carriage housing 132 which are reciprocally extensible as an entity along the length of the guide plate.

The lower carriage housing 130 is an elongated substantially rectangular structure having, as best seen in FIGS. 8 and 9, a substantially flat planar portion 134 with side flange portions 135 and 136 integrally depending from the opposed longitudinal side edges thereof. The depending flange 135 is in outwardly spaced juxtaposed relationship with the guide rail 122 of the guide plate 32 and the other depending flange 136 is in similarly spaced juxtaposed relationship with the opposite guide rail 125 of the guide plate 32. The inwardly facing surface of each of the depending flanges 135 and 136 is formed with a longitudinally entending V-shaped groove 138, in which a runner 140 is fixedly carried, such as by means of the end plates 142 shown in FIG. 7 as being bolted or otherwise attached to the opposite ends of the lower carriage housing 130. Each of the runners 140 are of square cross section and are carried in the V-shaped grooves 138 of their respective depending flanges 135 and 136 so that one of the corner edges of the runners 140 extend therefrom into longitudinally slidable engagement with the aligned V-shaped grooves 126 provided in the outwardly facing surfaces of the guide rails 122 and 124 of the guide plate 32. In this manner, the lower carriage housing 130 is supported on the guide plate 32 and longitudinally movable therealong. As seen best in FIGS. 7 and 8, an elongated gear rack 144 is fixedly mounted, such as by welding, so as to depend from the flat planar portion of the lower carriage housing 130.

A first reversibly drivable electric motor 146 is mounted by means of a suitable bracket 147 on the downwardly facing surface of the planar top 116 of the platform 28, so that the motor is disposed substantially within the downwardly opening cavity 118 defined by the platform. As seen best in FIGS. 10, 11 and 12, the output shaft 148 of the motor 146 is coupled to a driven shaft assembly 150 by means of a coupling nut 152. The coupling nut 152 is formed with a cross slot 153 for demountable engagement with a transverse pin 154 provided in one end of a power input end shaft segment 155 of the driven shaft assembly 150, and is also formed with a right angle slot 156 in which a radial pin 157 of the motor output shaft 148 is disposed. The coupling nut 152 is biased toward the power input end shaft segment 155 by means of the compression spring 158. The coupling nut 152 functions in exactly the same manner as the hereinbefore described coupling nut 93, and therefore, the driven shaft assembly 150 may be rotatably driven by the motor 146 or decoupled therefrom by means of the coupling nut 152 in which case, the driven shaft assembly 150 may be hand operated.

The driven shaft assembly 150 has a universal joint 160 which is interposed between the power input end shaft segment 155 and a power output end shaft segment 161, which is suitably coupled to drive a right angle drive mechanism 162, which is mounted by a bracked 163 so as to be within the cavity 118 of the platform 28. The right angle drive mechanism 162, as is well known in the art, is a device for transmitting power between shafts which are not parallel, such as by the use of spur bevel gears (not shown). The right angle drive mechanism 162 is driven by the shaft assembly 150 as described above and transmits the power to a vertically disposed output shaft 164 which is coupled, as shown in FIG. 8, by means of a slip-joint device 166 to drive a spur gear 168 which has an axially extending shaft 169. The output shaft 164 of the right angle drive mechanism 162 is secured, such as by means of a setscrew in one end of a bore 170 formed axially through a nipple 172. An adapter 174 having an axially depending shaft 175 is mounted for rotation with the nipple 172 by means of the shaft 175 being mounted in the opposite end of the bore of the nipple. The shaft 175 is provided with flats 176, and the upper end of the bore 170 of the nipple is suitably configured so that the shaft 175 will rotate with the nipple 172 and is axially slidable therein for reasons which will hereinafter be described in detail. The upper end of the adapter 174 is provided with an axial bore 177 in which the depending end of the spur gear shaft 169 is fixed, such as with a suitable set-screw, and the spur gear shaft 169 is rotatably journaled in the bearings 178 which are carried in a spur gear housing 180. The spur gear housing 180 is formed with a mounting flange 182 which is mounted on the top surface of the flat plate 120 of the guide plate 32 by suitable screws 183, and the housing extends downwardly into the opening 184 formed through the guide plate.

As hereinbefore mentioned, the guide plate 32 is vertically extensible and retractable relative to the platform 28. Therefore, the spur gear 168 and its axially depending shaft 169, the spur gear housing 180 and the adapter 174 are all vertically reciprocally movable with the guide plate 32 due to the above described manner in which those elements are mounted and interconnected. The nipple 172, on the other hand, is fixedly attached to the output shaft 164 of the right angle drive mechanism 162, and thus is not vertically movable. The axially slidably movable capability of the depending shaft 175 of the adapter 174 in the upper portion of the bore 170 of the nipple 172, i.e., the slip-joint 166, allows this vertical movement to occur without decoupling the spur gear 168 from the right angle drive 162.

The spur gear 168 is in meshing engagement with the elongated rack gear 144 which is fixedly mounted so as to depend from the lower carriage housing 130. Therefore, the first reversible drive motor 146 will be seen to be employed to reciprocally drive the lower carriage housing 130 along the length of the guide plate 32.

The upper carriage housing 132, which as hereinbefore mentioned, is fixedly attached to the lower carriage housing 130 for reciprocally extensible movement therewith. Such fixed attachment of the upper carriage housing 132 to the lower carriage housing 130 is accomplished such as with the bolts 186 shown in FIG. 7.

The upper carriage housing 132 is an elongated structure having, as best seen in FIG. 9, a downwardly opening channel 188 formed longitudinally therethrough. The channel 188 is defined by a spaced pair of relatively long vertical surfaces 189 and a relatively short horizontally disposed top surface 190. The open bottom of the channel 188 is disposed immediately above a central portion of the top surface of the planar portion 134 of the lower carriage housing 130, and an elongated runner 192, of the same type as the hereinbefore described runners 140, is fixedly mounted such as by welding, in a suitable V-shaped groove formed centrally along the length of the planar portion 134 of the lower carriage housing 130. A similar runner 194 is fixed to an elongated block 195 which is disposed within an elongated groove 196 which is formed in the upper carriage housing 132 and disposed so as to open downwardly onto the top surface 190 which defines the upper end of the channel 188. The elongated block 195, and thus the runner 194 carried thereby, are movable in the groove 196 toward and away from the channel 188 and suitable set-screws 197 (one shown) are provided to bear against the top of the elongated block 195.

The reciprocally extensible telescopic beam 38 is mounted in an on edge attitude in the channel 188 of the upper carriage housing 132. The beam 38 is of substantially rectangular cross section having opposed longitudinal side surfaces 198 and relatively shorter top and bottom edge surfaces 199 and 200. The top and bottom edge surfaces 199 and 200 each have a V-shaped groove 202 which extends longitudinally along those edges. The groove 202 of the top edge surface 199 is in bearing sliding engagement with the runner 194, and the groove 202 of the bottom edge surface 200 is in similar engagement with the runner 192 provided on the upper surface of the lower carriage housing 130. The beam 38 is therefore supported on and slidably movable along the runners 192 and 194, with precision alignment and loading adjustment of the bearing engagement between the runners and the beam being accomplished by the set-screws 197 being used to move the elongated block 195 and the runner 194 relative to the beam 38.

The elongated telescopic beam 38 is provided with an elongated rack 204 which, as seen best in FIGS. 8 and 9, extends laterally and downwardly from the lower end of one of the longitudinal side surfaces 198 of the beam and faces the top planar portion 134 of the lower carriage housing 130. The gear rack 204 extends, as seen in FIG. 7, longitudinally along the beam 38 from the rearwardly disposed end 207 thereof to a point identified as 208 which is spaced rearwardly from the forwardly disposed extensible end 210 of the beam. As seen best in FIG. 8, the gear teeth of the gear rack 204 face downwardly toward the upwardly facing gear teeth of the gear rack 128 which is fixedly carried on the upper surface of the guide plate 32, and the two gear racks 204 and 128 are vertically spaced and laterally offset with respect to each other.

Figure 9A:
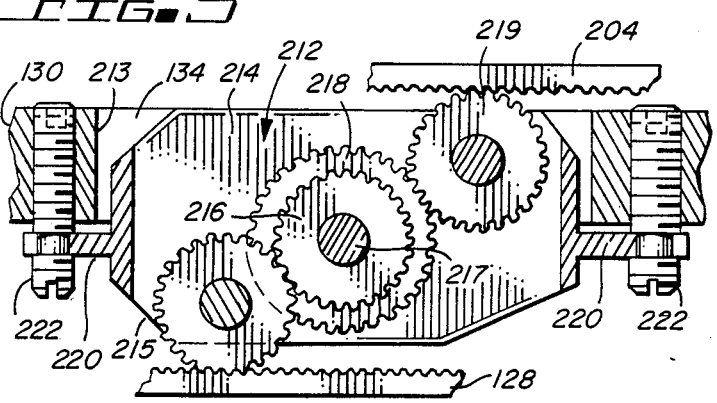
FIG. 9A is an enlarged fragmentary sectional view taken along the line 9A—9A of FIG. 9.
Figure 6:
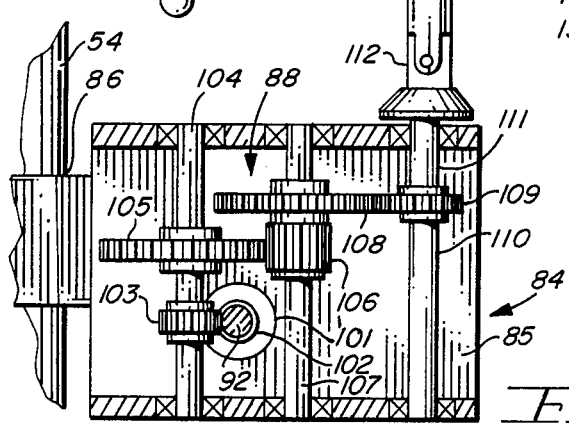
FIG. 6 is a fragmentary sectional view taken along the line 6—6 of FIG. 5.

A differential gear assembly 212, as seen in FIGS. 7, 9 and 9A is adjustably mounted on the downwardly facing surface of the flat planar portion 134 of the lower carriage housing 130 immediately below an opening 213 formed through the planar portion 134 of the housing 130. The differential gear assembly 212 includes a housing 214 which is open on its top and bottom. A reduction gear train is mounted in the housing 214 and includes a drive gear 215 which protrudes from the bottom of the housing 214 into meshed engagement with the gear rack 128 of the guide plate 32. The drive gear 215 is in meshing engagement with a first spur gear 216 which is carried on a countershaft 217 with the gear 216 transferring rotary motion to a second spur gear 218 carried on the same countershaft. The second spur gear 218 is in meshing engagement with the final driven gear 219 of the gear train, and the driven gear 219 protrudes from the top of the housing 214 into engagement with the gear rack 204 of the telescopic beam 38.

As seen best in FIG. 9A, the housing 214 of the differential gear assembly 212 is provided with a pair of mounting flanges 220 which extend oppositely from the opposite ends of the housing 214, and suitable bolts 222 pass through open ended slots formed in the flanges. By adjusting the bolts, the housing 214 can be positioned to achieve proper meshing engagement between the gears 215 and 219 and their respective gear racks 128 and 204.

When the lower carriage housing 130 is moved relative to the guide plate 32, by operation of the reversibly drivable electric motor 146 as hereinbefore described, the drive gear 215 of the differential gear assembly 212 will roll along the gear rack 128 of the guide plate 32. The rotary motion of the drive gear 215 will be transferred by the intermediate spur gears 216 and 218 to drive the final driven gear 219 at a reduced speed in comparison to that of the drive gear 215. The driven gear 219 will linearly drive the gear rack 204 in the same direction as the lower carriage housing 130 and therefore, the beam 38 will be telescopically moved to either an extended position or a retracted position relative to the upper carriage housing 132, as determined by the direction in which the lower carriage housing 130 is being moved.

By using the differential gear assembly 212 in the manner hereinbefore described, the single drive motor 146 will simultaneously drive both the carriage and the telescopic beam, and both the carriage and the beam must complete their extending movements, or their retracting movements at the same time. In the working environment in which the apparatus 20 is shown and is being described herein, a gear ratio of 0.71 was selected for the differential gear assembly 212, so that the carriage will move 44 inches while the beam moves 32 inches to provide the apparatus 20 with a total extension capability of 76 inches.

The article carrier means 40 which is demountably mounted on the extensible end 210 of the telescopic beam 38 may be of any configuration which is suitable for supporting the articles that are to be handled by the apparatus 20. In the illustrated embodiment, the article carrier means 40 is a bifurcated structure having a bight portion 224 from the opposite ends of which a spaced apart parallel pair of tines 225 extend. As seen best in FIG. 7A, a mounting structure 226 is integrally formed with the bight portion 224 so as to extend rearwardly and upwardly from between the opposite ends of the bight portion. The mounting structure 226 defines a rearwardly extending and upwardly spaced plate 228 with a depending spaced pair of gussets 230. The plate 228 and the gussets 230 cooperatively define a rearwardly and downwardly opening cavity 232 and a pin 234 is fixedly attached, such as by welding, so as to depend from the plate 228 into the cavity 232. The bifurcated article carrier 40 is demountably mounted on the extensible end 210 of the telescopic beam 38 by moving it downwardly to bring the pin 234 into engagement with a blind hole 236 formed in the top edge 199 of the beam 38 adjacent the extensible end 210 thereof. When the pin 234 is received in the hole 236, the plate 228 of the mounting structure will be in bearing engagement with the top edge of the beam, the rearwardly facing surface of the bight portion 224 of the bifurcated article carrier will be in bearing engagement with the end surface of the beam, and the gussets 230 will straddle the beam.

The article moving means 30, as hereinbefore mentioned, is coupled to the platform 28 by lifting means 34 which is operable to vertically elevate and retract the article moving means 30 relative to the platform. The lifting means 34 includes an identical pair of lifting devices 238 and 240 which are mounted in spaced apart locations on the platform 28 as seen best in FIGS. 7 and 10. Since the lifting devices 238 and 240 are identical, the following detailed description of the device 238 will be understood to also apply to the lifting device 240.

The lifting device 238, as seen best in FIG. 13, is disposed within an upwardly opening cavity 242 which is cast, or otherwise formed so as to open onto the top 116 of the platform 28, with the cavity being defined by an endless sidewall 243 and a bottom wall 244. A camshaft 246 is rotatably journaled in an axially depending boss 247 formed centrally through the bottom wall 244, with the lower end of the shaft extending downwardly beyond the boss, with an enlarged cylindrical head 248 of the camshaft being concentrically disposed within the cavity 242 and supported on a thrust bearing 249 which is interposed between the bottom surface of the head and the bottom wall 244 of the cavity 242. An externally threaded stud 250 is threadingly mounted in an internally threaded radial hole 251 formed in the periphery of the cylindrical head 248 of the camshaft, and a cam roller 252 is rotatably carried on the radially protruding end of the stud 250. A bearing ring 254 is fixedly mounted on the guide plate 32, such as by welding, so as to be spaced immediately above and coaxially disposed with respect to the cavity 242 and the camshaft 246. A cylindrical ring 256 is fixedly attached to the guide plate 32, such as by bolts 257 (one shown), so that the upper end of the cylindrical ring is in bearing engagement and fixedly attached to the bearing ring and thus to the guide plate 32. The cylindrical ring 256 depends from the guide plate 32 into a concentric position about the enlarged cylindrical head 248 of the camshaft 246. As seen best in FIGS. 14A through 14C, the cylindrical ring 256 is provided with a cam follower slot 258 which extends through the periphery thereof, with the roller 252 which extends radially from the head 240 of the camshaft being disposed in the slot 258. The cam follower slot 258 is configured with an inclined portion 260 which extends between an upper portion 261 and a lower portion 262.

When the camshaft 246 is rotated, in a manner to hereinafter be described, so that the cam roller 252 is disposed in the upper portion 261 of the cam follower slot 258, the cylindrical ring 256 will be in the fully retracted position thereof which, of course, locates the guide plate 32, and thus the entire article moving means 30, in its vertically retracted downwardly disposed position relative to the platform 28 as shown in FIG. 13. Upon rotational driving of the camshaft 246 in the direction of the arrow 263 in FIGS. 14B and 14C, the cam roller 252 will move from the upper portion 261 into the inclined portion 260 of the cam follower slot 258 as shown in FIG. 14B. Such movement of the cam roller 252 will move the cylindrical ring 256, and thus the entire article moving means 30 upwardly. Continued rotary driving of the camshaft 246 in the direction of the arrow 263 will move the cam roller into the lower portion 262 of the cam follower slot 258 and thereby move the cylindrical ring 256 and the entire article moving means 30 to its fully upwardly extended position. Rotational driving of the camshaft 246 in the direction opposite to that indicated by the arrow 263, will reverse the movement of the cam roller in the cam follower slot and thereby move the article moving means 30 to its retracted position.

As shown in FIGS. 10 and 12, a second reversibly drivable electric motor 266 is mounted by means of a suitable bracket 267 on the downwardly facing surface of the planar top 116 of the platform 28, so that the motor is disposed within the cavity 118 defined by the platform. The output shaft 268 of the motor 266 is coupled by means of a universal joint 270 to one end of a first worm gear 272 which is rotatably journaled and supported by a yoke 273 so as to be in the cavity 118 of the platform 28 proximate the lifting device 238. A drive shaft 274 is connected to the opposite end of the first worm gear 272 and extends therefrom to a second worm gear 276 which is similarly journaled and supported in a yoke 278, so as to be proximate the other lifting device 240. Therefore, the reversible motor 266 will synchronously drive the two worm gears 272 and 276.

As seen best in FIG. 10, the downwardly protruding ends of the camshafts 246 of the lifting devices 238 and 240 each have a gear segment 280 fixedly mounted thereon with the gear segment 280 of the lifting device 238 extending from its camshaft 246 into meshing engagement with the first worm gear 272 and the gear segment 280 of the other lifting device 240 extending therefrom into engagement with the second worm gear 276.

Operation

Figure 15A:
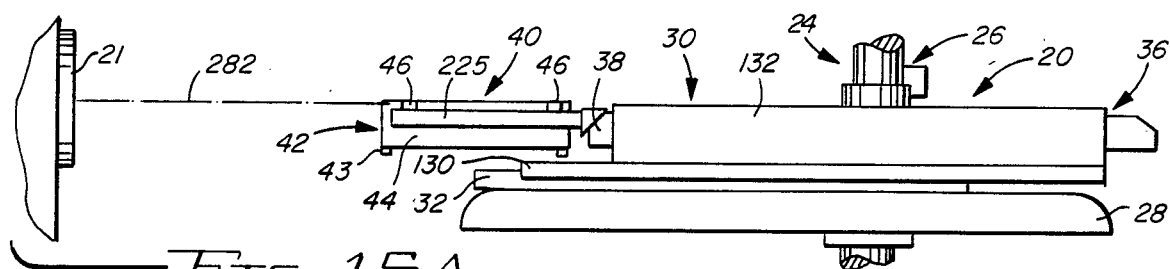
FIGS. 15A, 15B, 15C, 15D and 15E are diagrammatic side elevational views of the apparatus illustrating the various steps of the method of the present invention.
Figure 15B:
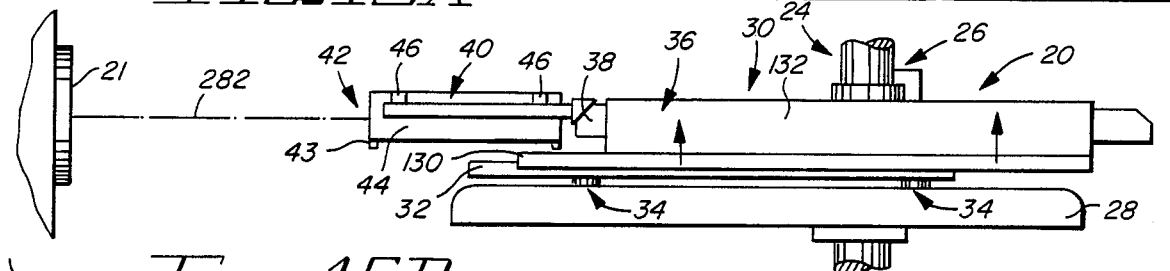
Figure 15C:
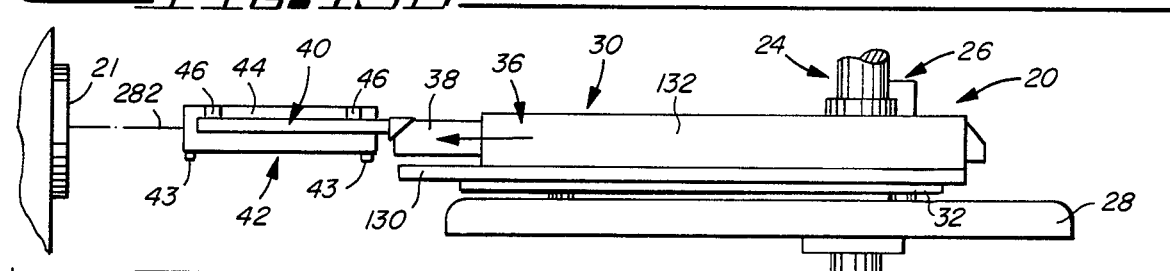
Figure 15D:
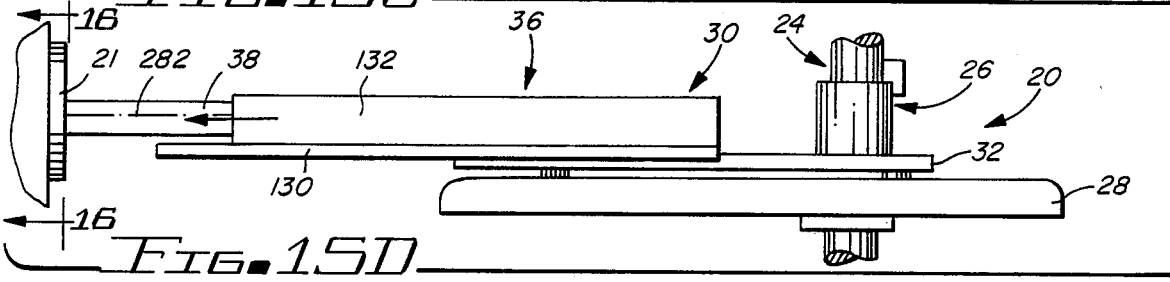
Figure 15E:
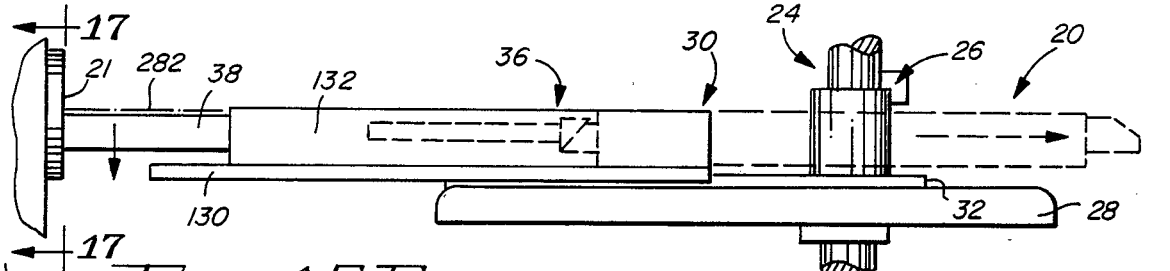
Figure 16:
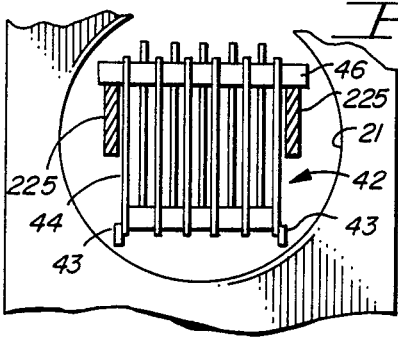
FIG. 16 is a fragmentary sectional view taken along the line 16—16 of FIG. 15D.
Figure 17:
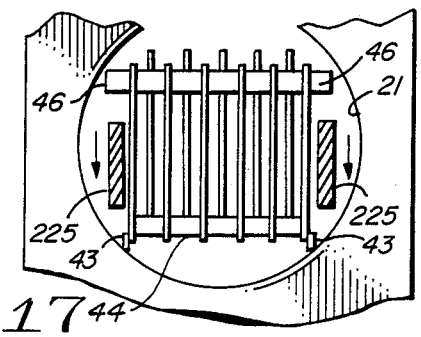
FIG. 17 is a fragmentary sectional view taken along the line 17—17 of FIG. 15E.

Reference is now made to FIGS. 15A through 15E and to FIGS. 16 and 17, which illustrate the operation of the apparatus 20 and the steps of the article handling method of the present invention.

FIG. 15A shows the article moving apparatus 20 as being positioned, by the vertically positionable carrier means 26 which is mounted on the support means 24, so as to be in alignment with one of the reactor furnaces 21. The article moving means 30 is in the horizontally and vertically retracted positions relative to the platform 28, and has the lifting ears 46 of the article supporting device, or boat 42, restingly supported on the tines 225 of the bifurcated article carrier means 40, so that the boat body 44 is suspendingly disposed between the tines. In this horizontally and vertically retracted position, the longitudinal centerline of the boat 42 is below the axial centerline 282 of the reactor furnace. In actual practice, the vertical travel of the article moving means 30 is quite small, and this travel is exaggerated in FIGS. 15A through 15E for clarity. By way of example, when the apparatus 20 is used to load the boat 42 into the reactor furnace 21 and subsequently extract the boat, the vertical travel will amount to about ⅜ of an inch.

FIG. 15B shows the next operational step wherein the lifting means 34 is operated to raise the article moving means 30 to its fully vertically elevated position. When so elevated, the longitudinal centerline of the boat 42 will move upwardly into substantial alignment, or slightly above, the axial centerline 282 of the reactor furnace 21.

FIG. 15C shows the article moving means 30 as being operated, by actuation of the first reversible motor 146 (FIG. 10) to move the lower and upper carriage housings 130 and 132 as an entity along the guide plate 32 and simultaneously extendingly move the telescopic beam 38 from the upper carriage housing 132.

FIG. 15D shows the article moving means 30 as having been moved to its fully extended position in which the boat 42 is located within the reactor furnace 21. As seen in FIG. 16, the reactor furnace 21 has a cylindrical interior having a diameter which is somewhat, but not very much, larger than the cross sectional dimensions of the boat. For example, in this instance, the clearance amounts to about ¼ of an inch. When the article moving means 30 is in the position shown in FIG. 15D, the boat 42 will be suspendingly positioned by the article carrier means 40 within the reactor furnace 21 so as not to touch the interior sidewalls thereof. Therefore, during insertion of the boat into the reactor furnace, the boat will not scrape, be dragged along, or otherwise disturb any processing residue which may be deposited on the internal surfaces of the reactor furnace, which, if disturbed, could damage or destroy the articles to be processed as a result of contamination.

FIG. 15E shows the article moving means 30 as being vertically retracted by means of reverse operation of the lifting means 34. When the vertical retraction, or lowering first begins, the boat 42 will move downwardly with the article moving means 30 until the depending feet 43 of the boat come into resting engagement with the lower arcuate portion of the interior sidewall of the reactor furnace as seen in FIG. 17. Continued downward movement of the article moving means 30 will disengagingly move the tines 225 of the bifurcated article carrier means 40 downwardly and thus out of supporting contact with the lifting ears 46 of the boat 42. By setting the boat 42 down into resting engagement within the reactor furnace in this manner, the feet 43 will move gently into contact with the interior of the furnace and little or no disturbing of the article contaminating processing residue will result. When the downward movement of the article moving means is completed, the tines 225 of the bifurcated article carrier means 40 will be in the approximate position shown in FIG. 17. In other words, the tines 225 will be intermediate the lifting ears 46 of the boat and the lower arcuate surface portion of the interior sidewalls of the reactor furnace.

After the boat 42 has been inserted in the reactor furnace 21 and the article moving means 30 has been moved to its fully vertically retracted position, the first reversibly drivable motor 146 (FIG. 10) is operated in the reverse direction to simultaneously retract the telescopic beam 38 and the upper and lower carriage housing 130 and 132. When such horizontal retraction is completed, the article moving means 30 will be in the fully retracted position i.e., both vertically and horizontally as shown in FIG. 15A. The steps shown in FIGS. 15A through 15E and as above described constitutes an article insertion operational mode of the apparatus 20.

When processing of the articles carried in the boat 42 is completed, the article moving means 30 of the apparatus 20 is actuated to accomplish an extraction operational mode. The first step of the extracting operational mode is to actuate the first reversibly drivable motor 146 to simultaneously horizontally extend the telescopic beam 38 and the lower and upper carriage housings 130 and 132. This step is accomplished with the article moving means 30 in the vertically retracted position so that the tines 225 of the bifurcated article carrier means 40 will enter the reactor furnace 21 in the lowered position as shown in FIG. 17. When the horizontally extended position of the article moving means 30 is reached, the lifting means 34 is actuated to move the article moving means 30 to its vertically extended position wherein the tines 225 will move upwardly into lifting engagement with the lifting ears 46 of the boat 42 and thereby gently lift the boat to its suspendingly supported position as shown in FIG. 16. The article moving means 30 is then horizontally retracted in the vertically elevated position thereof to complete the extraction operational mode of the apparatus 20.

While the principles of the invention have now been made clear in the illustrated embodiment, there will be immediately obvious to those skilled in the art, many modifications of structure, arrangements, proportions, the elements, materials, and components used in the practice of the invention, and otherwise, which are particularly adapted for specific environments and operation requirements without departing from those principles. The appended claims are therefore intended to cover and embrace any such modifications within the limits only of the true spirit and scope of the invention.

What we claim is:

1. An apparatus for handling various articles, comprising:
    (a) a platform of elongated configuration disposed in a substantially horizontal plane;
    (b) an article moving means for loading said articles mounted on said platform and reciprocally movable in a substantially horizontal plane between extended and retracted positions relative to said platform and reciprocally movable in a substantially vertical plane between elevated and retracted positions relative to said platform;

(c) an article carrier means for receiving and supporting said articles demountably mounted on said article moving means for movement therewith;

(d) a first means for reciprocally moving said article moving means in the substantially horizontal plane, said first means comprises a drive gear operably supported on said article moving means and operably engageable with a rack means coupled to said article moving means, a reversibly drivable motor mounted on said platform, and a drive shaft means located therebetween for operably coupling said drive gear and said reversibly drivable motor; and (e) a second means for reciprocally moving said article moving means in the substantially vertical plane.

2. An apparatus as claimed in claim 1 wherein said article moving means comprises:

(a) a guide plate mounted in overlaying relationship and extending longitudinally of said platform;

(b) a carriage means having a gear rack mounted thereon for transportably holding said articles reciprocally movable in the horizontal plane relative to said platform, said carriage means is supported on said guide plate and reciprocally movable in the substantially horizontal plane along the length of said guide plate; and (c) a beam telescopically mounted in said carriage means for movement therewith and for reciprocal movement in the substantially horizontal plane between extended and retracted positions relative to said carriage means.

3. An apparatus as claimed in claim 2 wherein the reciprocal movement of said beam relative to said carriage means is simultaneous in operation in at least one direction with the reciprocal movement of said carriage means relative to said platform, said simultaneous operation made to perform by said drive gear and reversibly drivable motor.

4. An apparatus for handling various articles, comprising:

(a) a platform of elongated configuration disposed in a substantially horizontal plane;

(b) an article moving means for loading said articles having (i) a guide plate mounted in overlaying relationship and extending longitudinally of said platform, (ii) a carriage means supported on said guide plate and reciprocally movable in the substantially horizontal plane along the length of said guide plate, and (iii) a beam telescopically mounted in said carriage means and telescopically reciprocal in the substantially horizontal plane between extended and retracted positions relative to said carriage means, said article moving means mounted on said platform and reciprocally movable in a substantially horizontal plane between extended and retracted positions relative to said platform and reciprocally movable in a substantially vertical plane between elevated and retracted positions relative to said platform;

(c) an article carrier means demountably mounted on said article moving means for movement therewith, said article carrier means for receiving and supporting said articles;

(d) a first means for reciprocally moving said article moving means in the substantially horizontal plane, said first means comprises (i) said carriage means having a gear rack mounted fast thereon, (ii) a drive gear supported on said guide plate in driving engagement with the gear rack of said carriage, (iii) a reversibly drivable motor mounted on said platform, (iv) a drive shaft assembly coupled between said reversibly drivable motor and said drive gear; and (e) a second means for reciprocally moving said article moving means in the substantially vertical plane.

5. An apparatus as claimed in claim 4 wherein said drive shaft assembly includes a coupling nut for selective decoupling of said drive gear from said reversibly drivable motor.

6. An apparatus as claimed in claim 4 and further comprising slip joint means interposed between said drive gear and said drive shaft assembly for maintaining the interconnection therebetween when said drive gear is moved with said article moving means in the substantially vertical plane.

7. An apparatus as claimed in claim 4 wherein said second means for reciprocally moving said article moving means in the substantially vertical plane comprises:

(a) lifting means interconnectingly interposed between said platform and said article moving means and rotatably operable between a vertically extended and a vertically retracted position;

(b) a reversibly drivable motor mounted on said platform; and (c) a drive shaft means coupled between said lifting means and said reversibly drivable motor for rotatably operating said lifting means.

8. An apparatus as claimed in claim 7 wherein said lifting means comprises a spaced apart pair of lifting devices which are interconnected by said drive shaft means for synchronous operation.

9. An apparatus as claimed in claim 7 wherein said lifting means includes at least one lifting device which comprises:

(a) a cam means vertically disposed and rotatably journaled in said platform; and (b) a cam follower means depending from said article moving means into engagement with said cam means for axially moving relative to said cam means upon rotational movement thereof.

10. An apparatus as claimed in claim 7 wherein said lifting means includes at least one lifting device which comprises:

(a) a camshaft means vertically disposed and journaled for rotation in said platform;

(b) a cam roller extending radially from the upper end of said camshaft means; and (c) a ring depending from said article moving means into axially movable concentric relationship about said camshaft means, said ring having a cam follower slot formed therein in which said cam roller is disposed for moving said ring in an axially extending direction when said camshaft is rotated in one direction and moving said ring in an axially retracting direction when said camshaft is rotated in the opposite direction.

11. An apparatus as claimed in claim 10 wherein said camshaft means has a gear segment fixed on the lower end thereof which is in engagement with said drive shaft means.

12. An apparatus as claimed in claim 11 wherein said drive shaft means includes a worm gear in driving engagement with said gear segment.

13. An apparatus as claimed in claim 4 and further comprising means attached to said platform for supporting and vertically moving said platform.

14. An apparatus as claimed in claim 4 and further comprising:
   (a) a pedestal;
   (b) an elongated standard extending upwardly from said pedestal;
   (c) a platform carrier means axially movable on said standard and fixedly attached to said platform for supporting said platform in the substantially horizontal plane; and
   (d) vertical drive means fixedly attached to said standard and coupled to said platform carrier means for moving of said platform carrier means along the length of said standard.

15. An apparatus as claimed in claim 14 wherein said platform carrier means comprises:
   (a) a tubular sleeve defining an axial bore which coaxially circumscribes said standard;
   (b) stabilizer means on said sleeve and in engagement with said standard for maintaining the coaxial relationship therebetween and preventing rotation of said sleeve about the longitudinal axis of said standard; and
   (c) bracket means extending radially from said tubular sleeve into fixed attachment with said platform.

16. An apparatus as claimed in claim 15 wherein said stabilizer means comprises an upper stabilizer at the upper end of said tubular sleeve and a lower stabilizer at the lower end of said tubular sleeve, said upper and lower stabilizers each including:
   (a) a housing integral with said tubular sleeve and defining at least one integral cavity which opens radially onto the periphery of said standard;
   (b) a roller in the cavity of said housing; and
   (c) means in said housing for adjustably moving said roller into bearing engagement with the periphery of said standard.

17. An apparatus as claimed in claim 16 and further comprising a groove formed longitudinally in said standard in which the periphery of said roller is in bearing engagement.

18. An apparatus as claimed in claim 15 wherein said stabilizer means comprises an upper stabilizer on the upper end of said tubular sleeve and a lower stabilizer on the lower end of said tubular sleeve, said upper and lower stabilizers each comprising:
   (a) a housing integral with said sleeve and defining a pair of internal cavities which are disposed at right angles with respect to each other, each of said pair of cavities opening radially onto the periphery of said standard;
   (b) a pair of rollers each disposed in a different one of the cavities formed in said housing; and
   (c) means in each of the cavities of said housing for adjustably moving the one of said rollers therein into bearing engagement with the periphery of said standard.

19. An apparatus as claimed in claim 18 wherein said means in each of said cavities of said housing comprises:
   (a) a clevis having a bight portion and a pair of tines which extend therefrom toward the periphery of said standard;
   (b) said roller journaled for rotation between the tines of said clevis; and
   (c) an adjustment screw threadingly carried in said housing and extending into bearing engagement with the bight portion of said clevis.

20. An apparatus as claimed in claim 18 and further comprising:
   (a) said standard having a pair of V-shaped grooves formed longitudinally in the periphery of said standard and radially disposed at right angles with respect to each other; and
   (b) each of said rollers having an endless beveled peripheral edge of V-shaped cross section configured for bearing engagement with different ones of the V-shaped grooves formed in said standard.

21. An apparatus as claimed in claim 14 wherein said vertical drive means comprises:
   (a) a housing attached to said standard;
   (b) a gear train in said housing and having a gear train drive shaft and an output shaft;
   (c) means coupled to the gear train drive shaft of said gear train for driving thereof;
   (d) an elongated worm gear coupled to the output shaft of said gear train and extending vertically therefrom; and
   (e) a worm gear nut on said platform carrier means and in driven engagement with said worm gear.

22. An apparatus as claimed in claim 21 wherein said gear train is a reduction gear train.

23. An apparatus as claimed in claim 21 wherein said means coupled to said gear train drive shaft for driving thereof is a reversibly drivable motor.

24. An apparatus as claimed in claim 21 wherein said means coupled to said gear train drive shaft for driving thereof is a hand wheel.

25. An apparatus as claimed in claim 21 wherein said means coupled to said gear train drive shaft for driving thereof comprises:
   (a) a reversibly drivable motor coupled to one end of said gear train drive shaft;
   (b) a hand wheel carried on the other end of said gear train drive shaft; and
   (c) said reversibly drivable motor coupled to the one end of said gear train drive shaft by means of a coupling nut means by which said reversibly drivable motor is selectively decoupled from said gear train drive shaft.

26. An apparatus as claimed in claim 4 wherein said article carrier means comprises a bifurcated element having a bight member from the opposite ends of which a pair of article supporting tines extend and having means intermediate the opposite ends of said bight member for demountable attachment to said article moving means.

27. An apparatus for loading articles to be processed into a reactor furnace and unloading the articles subsequent to the processing, comprising:
   (a) at least one reactor furnace;
   (b) a platform of elongated configuration disposed in a substantially horizontal plane and in spaced relationship with respect to said reactor furnace;
   (c) a means for supporting and vertically moving said platform into substantial alignment with the interior of said reactor furnace;
   (d) an article moving means for loading said articles mounted on said platform and reciprocally movable relative to said platform in a substantially horizontal plane toward and away from said reactor furnace, and reciprocally movable relative to said platform in a substantially vertical plane between elevated and retracted positions;

(e) an article carrier means demountable mounted on said article moving means for movement therewith into and out of said reactor furnace, said article carrier means for supportingly carrying the articles to be processed into said reactor furnace prior to the processing of the articles therein and subsequently extracting those articles after processing;

(f) first means for reciprocally moving said article moving means in the substantially horizontal plane, said first means comprises a drive gear operably supported on said article moving means and operably engageable with a rack means coupled to said article moving means, a reversibly drivable motor mounted on said platform, and a drive shaft means located therebetween for operably coupling said drive gear and said reversibly drivable motor; and (g) a second means for reciprocally moving said article moving means in the substantially vertical plane.

28. An apparatus as claimed in claim 27 wherein said article moving means comprises:
(a) a guide plate mounted in overlaying relationship and extending longitudinally of said platform;
(b) a carriage means having a gear rack mounted thereon for transportably holding said articles reciprocally movable in the horizontal plane relative to said platform, said carriage means is supported on said guide plate and reciprocally movable in the substantially horizontal plane along the length of said guide plate; and
(c) a beam telescopically mounted in said carriage means for movement therewith and for reciprocal movement in the substantially horizontal plane between extended and retracted positions relative to said carriage means.

29. An apparatus as claimed in claim 28 wherein the reciprocal movement of said beam relative to said carriage means is simultaneous in operation in at least one direction with the reciprocal movement of said carriage means relative to said platform, said simultaneous operation made to perform by said drive gear and reversibly drivable motor.

30. An apparatus for loading articles to be processed into a reactor furnace and unloading the articles subsequent to the processing, comprising:
(a) at least one reactor furnace;
(b) a platform of elongated configuration disposed in a substantially horizontal plane and in spaced relationship with respect to said reactor furnace;
(c) a means for supporting and vertically moving said platform into substantial alignment with the interior of said reactor furnace;
(d) an article moving means for loading said articles having (i) a guide plate mounted in overlaying relationship and extending longitudinally of said platform, said guide plate has a gear rack mounted fast thereon, (ii) a carriage means supported on said guide plate and reciprocally movable in the substantially horizontal plane along the length of said guide plate, said carriage means has a gear rack mounted fast thereon, (iii) a beam telescopically mounted in said carriage means and telescopically reciprocal in the substantially horizontal plane between extended and retracted positions relative to said carriage means, said article moving means mounted on said platform and reciprocally movable relative to said platform in a substantially horizontal plane toward and away from said reactor furnace, and reciprocally movable relative to said platform in a substantially vertical plane between elevated and retracted positions, said beam has a gear rack mounted fast thereon;

(e) an article carrier means demountably mounted on said article moving means for movement therewith into and out of said reactor furnace, said article carrier means for supportingly carrying the articles to be processed into said reactor furnace prior to the processing of the articles therein and subsequently extracting those articles after processing;

(f) a first means for reciprocally moving said article moving means in the substantially horizontal plane, said first means comprises (i) a drive gear supported on said guide plate in driving engagement with the gear rack of said carriage means, (ii) a reversibly drivable motor mounted on said platform, (iii) a drive shaft assembly coupled between said reversibly drivable motor and said drive gear, and (iv) a gear train means mounted on said carriage means for movement therewith, said gear train means having a first gear in engagement with the gear rack of said guide plate which drives said first gear when said carriage means is moved along the length of said guide plate, said gear train means having a second gear in driving engagement with the gear rack of said beam and having intermediate gears meshingly interposed between said first and second gears; and (g) a second means for reciprocally moving said article moving means in the substantially vertical plane.

31. An apparatus as claimed in claim 30 wherein said gear train means is configured to provide a reduction gear ratio.

32. An apparatus as claimed in claim 30 wherein said drive shaft assembly includes a coupling nut for selective decoupling of said drive gear from said reversibly drivable motor.

33. An apparatus as claimed in claim 30 and further comprising slip joint means interposed between said drive gear and said drive shaft assembly for maintaining the interconnection therebetween when said drive gear is moved with said article moving means in the substantially vertical plane.

34. An apparatus as claimed in claim 30 wherein said second means for reciprocally moving said article moving means in the substantially vertical plane comprises:
(a) lifting means interconnectingly interposed between said platform and said article moving means and rotatably operable between a vertically extended and a vertically retracted position;
(b) a reversibly drivable motor mounted on said platform; and
(c) a drive shaft means coupled between said lifting means and said reversibly drivable motor for rotatably operating said lifting means.

35. An apparatus as claimed in claim 34 wherein said lifting means comprises a spaced apart pair of lifting devices which are interconnected by said drive shaft means for synchronous operation.

36. An apparatus as claimed in claim 34 wherein said lifting means includes at least one lifting device which comprises:

(a) a cam means vertically disposed and rotatably journaled in said platform; and
(b) a cam follower means depending from said article moving means into engagement with said cam means for axially moving relative to said cam means upon rotational movement thereof.

37. An apparatus as claimed in claim 34 wherein said lifting means includes at least one lifting device which comprises:
(a) a camshaft means vertically disposed and journaled for rotation in said platform;
(b) a cam roller extending radially from the upper end of said camshaft means; and
(c) a ring depending from said article moving means into axially movable concentric relationship about said camshaft means, said ring having a cam follower slot formed therein in which said cam roller is disposed for moving said ring in an axially extending direction when said camshaft is rotated in one direction and moving said ring in an axially retracting direction when said camshaft is rotated in the opposite direction.

38. An apparatus as claimed in claim 37 wherein said camshaft means has a gear segment fixed on the lower end thereof which is in engagement with said drive shaft means.

39. An apparauts as claimed in claim 38 wherein said drive shaft means includes a worm gear in driving engagement with said gear segment.

40. An apparatus as claimed in claim 30 and further comprising means attached to said platform for supporting and vertically moving said platform.

41. An apparatus as claimed in claim 30 and further comprising:
(a) a pedestal;
(b) an elongated standard extending upwardly from said pedestal;
(c) a platform carrier means axially movable on said standard and fixedly attached to said platform for supporting said platform in the substantially horizontal plane; and
(d) vertical drive means fixedly attached to said standard and coupled to said platform carrier means for moving of said platform carried means along the length of said standard.

42. An apparatus as claimed in claim 41 wherein said platform carrier means comprises:
(a) a tubular sleeve defining an axial bore which coaxially circumscribes said standard;
(b) stabilizer means on said sleeve and in engagement with said standard for maintaining the coaxial relationship therebetween and preventing rotation of said sleeve about the longitudinal axis of said standard; and
(c) bracket means extending radially from said tubular sleeve into fixed attachment with said platform.

43. An apparatus as claimed in claim 42 wherein said stabilizer means comprises an upper stabilizer at the upper end of said tubular sleeve and a lower stabilizer at the lower end of said tubular sleeve, said upper and lower stabilizers each including:
(a) a housing integral with said tubular sleeve and defining at least one integral cavity which opens radially onto the periphery of said standard;
(b) a roller in the cavity of said housing; and
(c) means in said housing for adjustably moving said roller into bearing engagement with the periphery of said standard.

44. An apparatus as claimed in claim 43 and further comprising a groove formed longitudinally in said standard in which the periphery of said roller is in bearing engagement.

45. An apparatus as claimed in claim 42 wherein said stabilizer means comprises an upper stabilizer on the upper end of said tubular sleeve and a lower stabilizer on the lower end of said tubular sleeve, said upper and lower stabilizers each comprising:
(a) a housing integral with said sleeve and defining a pair of internal cavities which are disposed at right angles with respect to each other, each of said pair of cavities opening radially onto the periphery of said standard;
(b) a pair of rollers each disposed in a different one of the cavities formed in said housing; and
(c) means in each of the cavities of said housing for adjustably moving the one of said rollers therein into bearing engagement with the periphery of said standard.

46. An apparatus as claimed in claim 45 wherein said means in each of said cavities of said housing comprises:
(a) a clevis having a bight portion and a pair of tines which extend therefrom toward the periphery of said standard;
(b) said roller journaled for rotation between the tines of said clevis; and
(c) an adjustment screw threadingly carried in said housing and extending into bearing engagement with the bight portion of said clevis.

47. An apparatus as claimed in claim 45 and further comprising:
(a) said standard having a pair of V-shaped grooves formed longitudinally in the periphery of said standard and radially disposed at right angles with respect to each other; and
(b) each of said rollers having an endless beveled peripheral edge of V-shaped cross section configured for bearing engagement with different ones of the V-shaped grooves formed in said standard.

48. An apparatus as claimed in claim 44 wherein said vertical drive means comprises:
(a) a housing attached to said standard;
(b) a gear train in said housing and having a gear train drive shaft and an output shaft;
(c) means coupled to the gear train drive shaft of said gear train for driving thereof;
(d) an elongated worm gear coupled to the output shaft of said gear train and extending vertically therefrom; and
(e) a worm gear nut on said platform carrier means and in driven engagement with said worm gear.

49. An apparatus as claimed in claim 48 wherein said gear train is a reduction gear train.

50. An apparatus as claimed in claim 48 wherein said means coupled to said gear train drive shaft for driving thereof is a reversibly drivable motor.

51. An apparatus as claimed in claim 48 wherein said means coupled to said gear train drive shaft for driving thereof is a hand wheel.

52. An apparatus as claimed in claim 48 wherein said means coupled to said gear train drive shaft for driving thereof comprises:
(a) a reversibly drivable motor coupled to one end of said gear train drive shaft;
(b) a hand wheel carried on the other end of said gear train drive shaft; and (c) said reversibly drivable motor coupled to the one end of said gear train drive shaft by means of a coupling nut means by which said reversibly drivable motor is selectively decoupled from said gear train drive shaft.

53. An apparatus as claimed in claim 30 wherein said article carrier means comprises a bifurcated element having a bight member from the opposite ends of which a pair of article supporting tines extend and having means intermediate the opposite ends of said bight member for demountable attachment to said article moving means.

54. An apparatus for handling semiconductor wafers, comprising:
(a) a platform:
(b) a moving means for loading said articles mounted on said platform and reciprocally movable in one plane between extended and retracted positions relative to said platform and reciprocally movable in another plane between elevated and retracted positions relative to said platform;
(c) semiconductor carrier means demountable mounted on said moving means for movement therewith, said carrier means for receiving and supporting the wafers to be handled;
(d) a first means for reciprocally moving said article moving means in the substantially horizontal plane, said first means comprises a drive gear operably supported on said article moving means and operably engageable with a rack means coupled to said article moving means a reversibly drivable motor mounted on said platform, and a drive shaft means located therebetween for operably coupling said drive gear and said reversibly drivable motor; and
(e) a second means for reciprocally moving said article moving means in the substantially vertical plane.

55. An apparatus as claimed in claim 54 herein said article moving means comprises:
(a) a guide plate mounted in overlaying relationship and extending longitudinally of said platform;
(b) a carriage means having a gear rack mounted thereon for transportably holding said articles reciprocally movable in the horizontal plane relative to said platform, said carriage means is supported on said guide plate and reciprocally movable in the substantially horizontal plane along the length of said guide plate; and
(c) a beam telescopically mounted in said carriage means for movement therewith and for reciprocal movement in the substantially horizontal plane between extended and retracted positions relative to said carriage means.

56. An apparatus as claimed in claim 55 wherein the reciprocal movement of said beam relative to said carriage means is simultaneous in operation in at least one direction with the reciprocal movement of said carriage means relative to said platform said simultaneous operation made to perform by said drive gear and reversibly drivable motor.

57. An apparatus as claimed in claim 55 and further comprising means for reciprocally driving said carriage means along the length of said guide plate and simultaneously reciprocally driving said beam relative to said carriage means.

58. An apparatus for handling semiconductor wafers, comprising:
(a) a platform;
(b) a moving means for loading said wafers mounted on said platform and reciprocally movable in one plate between extended and retracted positions relative to said platform and reciprocally movable in another plane between elevated and retracted positions relative to said platform, said moving means comprises (i) an elongated guide plate mounted in overlying relationship with respect to said platform, said guide plate has a gear rack mounted fast thereon, (ii) a carriage means supported on said guide plate and reciprocally movable in the one plane along the length of said guide plate, said carriage means has a gear rack mounted fast thereon, (iii) a beam telescopically mounted in said carriage means and telescopically reciprocal in the one plane between extended and retracted positions relative to said carriage means, and (iv) a means for reciprocally driving said carriage means along the length of said guide plate and simultaneously reciprocally driving said beam relative to said carriage means, said means for reciprocally driving said carriage means has a drive gear supported on said guide plate in driving engagement with the gear rack of said carriage, a reversibly drivable motor mounted on said platform, and a drive shaft assembly coupled between said reversibly drivable motor and said drive gear; and
(c) a semiconductor carrier means for receiving and supporting said wafers to be handled, said carrier means demountably mounted on said moving means for movement therewith.

59. An apparatus as claimed in claim 58 and further comprising slip joint means interposed between said drive gear and said drive shaft assembly for maintaining the interconnection therebetween when said drive gear is moved with said moving means in the other plane.

60. An apparatus as claimed in claim 58 and further comprising means interconnectingly interposed between said platform and said moving means for reciprocally moving said moving means in the other plane between the elevated and retracted positions relative to said platform.

61. An apparatus as claimed in claim 60 wherein said means for reciprocally moving said moving means in the other plane relative to said platform comprises:
(a) lifting means interconnectingly interposed between said platform and said moving means and operable between the elevated and retracted positions;
(b) a reversibly drivable motor mounted on said platform; and
(c) a drive shaft means coupled between said lifting means and said reversibly drivable motor for operating said lifting means.

62. An apparatus as claimed in claim 61 wherein said lifting means comprises a spaced apart pair of lifting devices which are interconnected by said drive shaft means for synchronous operation.

63. An apparatus as claimed in claim 61 wherein said lifting means includes at least one lifting device which comprises:
(a) a cam means and rotatably journaled in said platform and extending toward said moving means; and
(b) a cam follower means extending from said moving means into engagement with said cam means for axially moving relative to said cam means upon rotational movement thereof.

64. An apparatus as claimed in claim 61 wherein said lifting means includes at least one lifting device which comprises:
 (a) a camshaft means and journaled for rotation in said platform and extending therefrom toward said moving means;
 (b) a cam roller extending radially from the upper end of said camshaft means; and
 (c) a ring extending from said moving means into axially movable concentric relationship about said camshaft means, said ring having a cam follower slot formed therein in which said cam roller is disposed for moving said ring in an axially extending direction when said camshaft is rotated in one direction and moving said ring in an axially retracting direction when said camshaft is rotated in the opposite direction.

65. An apparatus as claimed in claim 58 and further comprising:
 (a) a pedestal;
 (b) an elongated standard extending upwardly from said pedestal;
 (c) a platform carrier means axially movable on said standard and fixedly attached to said platform for supporting said platform in the one plane in which said moving means is reciprocally movable; and
 (d) drive means fixedly attached to said standard and coupled to said platform carrier means for moving of said platform carrier means along the length of said standard.

66. An apparatus as claimed in claim 65 wherein said platform carrier means comprises:
 (a) a tubular sleeve defining an axial bore which coaxially circumscribes said standard;
 (b) stabilizer means on said sleeve and in engagement with said standard for maintaining the coaxial relationship therebetween and preventing rotation of said sleeve about the longitudinal axis of said standard; and
 (c) bracket means extending radially from said tubular sleeve into fixed attachment with said platform.

67. An apparatus as claimed in claim 66 wherein said stabilizer means comprises a first stabilizer at one end of said tubular sleeve and a second stabilizer at the other end of said tubular sleeve, said first and second stabilizers each including:
 (a) a housing integral with said tubular sleeve and defining at least one cavity which opens radially onto the periphery of said standard;
 (b) a roller in the cavity of said housing; and
 (c) means in said housing for adjustably moving said roller into bearing engagement with the periphery of said standard.

68. An apparatus as claimed in claim 67 and further comprising a groove formed longitudinally in said standard in which the periphery of said roller is in bearing engagement.

69. An apparatus as claimed in claim 66 wherein said stabilizer means comprises a first stabilizer on one end of said tubular sleeve and a second stabilizer on the other end of said tubular sleeve, said first and second stabilizers each comprising:
 (a) a housing integral with said sleeve and defining a pair of internal cavities which are disposed at substantially right angles with respect to each other, each of said pair of cavities opening radially onto the periphery of said standard;
 (b) a pair of rollers each disposed in a different one of the cavities formed in said housing; and
 (c) means in each of the cavities of said housing for adjustably moving the one of said rollers therein into bearing engagement with the periphery of said standard.

70. An apparatus as claimed in claim 69 and further comprising:
 (a) said standard having a pair of V-shaped grooves formed longitudinally in the periphery of said standard and radially disposed at substantially right angles with respect to each other; and
 (b) each of said rollers having an endless beveled peripheral edge of V-shaped cross section configured for bearing engagement with different ones of the V-shaped grooves formed in said standard.

71. An apparatus as claimed in claim 65 wherein said drive means comprises:
 (a) a housing attached to said standard;
 (b) a gear train in said housing and having a gear train drive shaft and an output shaft;
 (c) means coupled to the gear train drive shaft of said gear train for driving thereof;
 (d) an elongated worm gear coupled to the output shaft of said gear train and extending therefrom; and
 (e) a worm gear nut on said platform carrier means and in driven engagement with said worm gear.

72. A method for loading articles to be processed into a reactor furnace, comprising the steps of:
 (a) placing at least one article to be processed in an article support device
 (b) suspending said article support device on an article carrier provided on an article handling apparatus which is in horizontally aligned spaced relationship with respect to the interior of said reactor furnace, said article handling apparatus having a guide plate mounted in overlaying relationship and extending longitudinally of a platform, a carriage means supported on said guide plate, a beam telescopically mounted on said carrige means, and said article carrier supported by an end of said beam;
 (c) elevating said guide plate relative to said platform to bring the centerline of said article support device into substantial alignment with the centerline of the interior of said reactor furnace;
 (d) extending said article handling apparatus horizontally toward said reactor furnace by a drive gear supported on said guide plate in driving engagement with a gear rack mounted on said carriage means and a reversibly drivable motor mounted on said platform to insert said article support device in suspended disposition within said reactor furnace;
 (e) retracting said article handling device vertically to move said article support device down into resting engagement with the interior of said reactor furnace and to disengage said article carrier means from said article support device;
 (f) retracting said article handling device horizontally from said reactor furnace;
 (g) extending said article handling apparatus horizontally toward said reactor furnace for moving said article carrier into said reactor furnace;
 (h) elevating said article handling apparatus to bring said article carrier into supporting engagement with said article support device and lifting said article support device to a suspended disposition within said reactor furnace; and (i) retracting said article handling apparatus horizontally from said reactor furnace to extract said article support device therefrom.

73. The method of claim 72 wherein said method of extending said article handling apparatus horizontally toward said reactor furnace further includes moving a gear train means mounted on said carriage means for movement therewith, said gear train means having a first gear in engagement with the gear rack of said guide plate which drives said first gear when said carriage means is moved along the length of said guide plate, said gear train means having a second gear in driving engagement with the gear rack of said beam and having intermediate gears meshingly interposed between said first and said second gears.

* * * * *